(12) United States Patent
Dajer et al.

(10) Patent No.: US 7,062,242 B2
(45) Date of Patent: Jun. 13, 2006

(54) DYNAMIC PATH GAIN COMPENSATION FOR RADIOS IN WIRELESS COMMUNICATION SYSTEMS

(75) Inventors: Miguel Dajer, Succasunna, NJ (US); Edward Ellis Eibling, Convent Station, NJ (US); Mark Y. McKinnon, Howell, NJ (US)

(73) Assignee: Lucent Technologies Inc., Murray Hill, DE (US)

( * ) Notice: Subject to any disclaimer, the term of this patent is extended or adjusted under 35 U.S.C. 154(b) by 313 days.

(21) Appl. No.: 10/209,944

(22) Filed: Aug. 2, 2002

(65) Prior Publication Data

US 2002/0187810 A1 Dec. 12, 2002

Related U.S. Application Data

(62) Division of application No. 09/396,829, filed on Sep. 14, 1999, now Pat. No. 6,507,732.

(51) Int. Cl.
*H04B 1/06* (2006.01)
*H04B 7/00* (2006.01)

(52) U.S. Cl. .............................. 455/232.1; 455/277.2; 315/371; 348/497

(58) Field of Classification Search .............. 455/232.1, 455/277.2; 315/371; 348/497
See application file for complete search history.

(56) References Cited

U.S. PATENT DOCUMENTS

| 4,532,541 A | * | 7/1985 | Cooper ...................... 348/497 |
| 5,883,477 A | * | 3/1999 | Wilber ....................... 315/371 |
| 6,507,732 B1 | * | 1/2003 | Dajer et al. .............. 455/277.2 |

* cited by examiner

*Primary Examiner*—William Cumming

(57) ABSTRACT

A DPRAM is placed in the RF path before the digital to analog converter, to provide dynamic path gain compensation to the digital signal prior to conversion to an analog signal. The DPRAM stores corrections to the signal to compensate for amplitude losses in the signal arising from heat and non-linearities. The DPRAM has two sets of identical addresses. A logic switch, alternately directs an input signal to one of the two sets of addresses. Pre-calculated signal values which compensate for path gain are stored in one of the two sets of addresses in the DPRAM. The signal input to the DPRAM is directed to the other block. The value of the signal input to the DPRAM will determine the address to which the new value can be found. It is this new value which is actually input to the DAC and from which an analog signal is created. The updated values written to the DPRAM are the signal values with path gain compensation that is independently calculated and applied to the RF signal by a Dynamic Path Gain Compensation Controller ("DPGCC"). The DPGCC may apply any known algorithms to compute the path gain compensation and adjust the signal accordingly. In one advantageous embodiment the DPGCC accounts for thermal losses and non-linearity and takes into consideration overdrive protection constraints.

8 Claims, 2 Drawing Sheets

DYNAMIC PATH GAIN COMPENSATION FOR RADIOS IN WIRELESS COMMUNICATION SYSTEMS

This application is a continuation divisional of co-pending application Ser. No. 09/396,829, filed on Sep. 14, 1999, now U.S. Pat. No. 6,500,732 the entire contents of which are hereby incorporated by reference and for which priority is claimed under 35 U.S.C. §120.

FIELD OF THE INVENTION

This invention relates generally to wireless communication systems and more specifically to gain compensation in the digital front end of a radio transmitter.

BACKGROUND OF THE INVENTION

The nature of CDMA, which requires a high peak power to average power ratio of 8 dB or higher, makes providing a linear RF path of constant gain, a difficult and costly challenge. Since base station cost is RF amplifier-centric, failure to accurately regulate the RF path either wastes amplifier power or under utilizes the amplifier capacity. The base station cost in terms of size, weight, heat, and direct current (DC) power, is directly affected by the method of regulating the RF path gain.

Furthermore, preserving the nominal path gain is important to maximizing service provider revenue and mobile service availability. If path gain is calibrated too low, the RF amplifier power overload protection acts too soon at a lower air interface call capacity, which implies lower revenue for the service provider and disappointed customers unable to obtain service on demand. For example, if due to losses, the path gain was 1 dB lower than expected, a call that would normally require a gain setting of 60 digital gain units ("dgu") (a unit of voltage) would require 67 dgus to provide the mobile with the same signal power, measured in $dgu^2$ (e.g., $1.259*60^2 \sim = 67^2$, where 1 dB$\sim$=1.259). Since the maximum power is nominally 77760 $dgu^2$, about seventeen 60 dgu calls could be supported (e.g., 77760−16800 overhead$\sim$=17*60*60) where as, only about thirteen, 67 dgu calls could be supported (e.g., 77760−16800 overhead$\sim$=13*67*67). Therefore, while the system would try to support seventeen calls, it would be doing so at 67 dgu per call. The RF amplifier overload protection would kick in at about thirteen calls, supporting roughly only three quarters of the number of calls that should be supported.

If, on the other hand, path gain is calibrated too high, equipment life may be shortened and as described below, the FCC can take regulatory action against the service provider for spectral non-compliance. Indeed, a high path gain may cause too much DC current in the power amplifier, blowing the power supply fuse and shutting down the RF path through that amplifier. A high path gain also distorts the RF coverage footprint, which increases interference to neighboring cells and lowers the network air interface capacity. This occurs because: (i) path gain is applied equally to the traffic signals and the pilot signal. The pilot signal is used by mobile stations to determine the base station they are to listen to for their signal. With high path gain, the pilot signal will be too strong, thereby attracting too much traffic away from neighboring cells; (ii) the amplifier is operated at a higher than expected power (e.g., If the RF path gain increased 1 dB higher than the nominal path gain, a 60 dgu call would only need 54 dgu to provide the mobile with the necessary power (e.g., $60^2/1.259\sim=54^2$, where 1 dB$\sim$=1.259). The cell would therefore accept and attempt to support approximately 20 calls, as opposed to 17, before amplifier overload protection kicks in. This in turn could introduce noise and out-of-band emissions. Mobile stations would then require more signal power to overcome the noise and FCC out-of-band emission power limits could be exceeded.

Present art provides individual solutions for each constraint that affects path gain such that they generally do not account for interactions among components in the RF path. Furthermore, most of the solutions are static and non-tunable. These include: using additional semiconductor junctions to improve linearity in each amplification stage over the operational temperature range; matching component parts by selection, which requires extra steps in the manufacturing process; laser trimming of components until their properties satisfy the specifications, which also requires extra production steps; and connecting passive components with inverse thermal characteristics in series to constrain path gain variance over temperature.

Furthermore, current solutions use wide tolerance ranges for path gain, requiring larger and more costly equipment than would be required with tighter tolerances. Much control is essentially open loop, providing no feedback means for adjusting the path gain based on actual performance of the path. Rather, conservative nominal values are assigned to constraints, a priori. Manual adjustment is often required to optimize performance, which only remains optimal over a narrow temperature range.

There are also closed loop control solutions that measure input and output power and adjust the path gain to preserve the nominal gain, which is the desired ratio of output power over input power. This is done within components as well as across a plurality of components.

Accordingly, it is desirable to preserve a nominal RF path gain seamlessly and accurately by compensating for gain changes in multiple physical components, which may be non-linear, without exceeding their physical constraints and in a way that provides for performance tuning and product evolution.

SUMMARY OF THE INVENTION

A dual port RAM ("DPRAM") is placed in the RF path at some point prior to the digital to analog converter ("DAC"), to provide dynamic path gain compensation to the digital signal prior to conversion to an analog signal. One DPRAM can be used at the output of the digital up converter ("DUC"), or separate DPRAMs, one for each of the I and Q streams may be placed in the RF stream prior to the DUC. In accordance with the present invention the DPRAM stores corrections to the signal to compensate for path gain variance, such as amplitude losses in the signal arising from heat and non-linearities.

The DPRAM acts as an ultra-fast multiplier. The DPRAM can operate at higher data rates and with a lower transport latency than conventional high-speed multipliers. The DPRAM multiplies by table lookup. In the DPRAM, the pre-calculated product of the path gain correction times the signal level is stored for each possible signal level. This offers another advantage in that the signal multiplication can be non-linear. In other words, a different gain correction can be used for each possible signal level.

The DPRAM typically comprises two blocks of RAM, although multiple blocks of RAM are possible. One block is for replacing the input signal with a multiple of the input signal, in lieu of actually multiplying the input signal on the fly. The uncorrected input signal level drives the DPRAM address lines and the corrected signal level, which is stored within one of the blocks of the DPRAM, comes out on the data lines. The other, inactive, block(s) is (are) for updating, where necessary, the next set of corrections by a controller. Thus, the dual port on the DPRAM allows one block of address space to exist in the signal stream and the other block(s) of address space to be accessible by the controller. A logic switch alternately directs an input signal to one of the blocks, which seamlessly provides the corrected signal on the data lines.

At the input interface to the DPRAM, the logic switch toggles one of the address bits, which may advantageously be the most significant bit ("MSB") although any of the address bits may be used. Thus for any particular value being input to the DPRAM, an "off" MSB will direct the signal to one block, while an "on" MSB will direct the signal to another parallel block. Updated values are written to a first block while the input from the DUC is directed to a second block. After the updating is complete, the logic switch will cause the signal from the DUC to be input to the second block. At this point, and until the logic switch is toggled again, updates will be written to the first block. This allows all correction calculations to occur in the digital realm. The logical switch mechanism could also use multiple address lines for selecting the multiplying block and the updatable block. In particular, this would be the case where the DPRAM is divided into more than two blocks of RAM.

The updated values written to the DPRAM are the signal values with path gain compensation. The path gain compensation is independently calculated and applied to the RF signal by a Dynamic Path Gain Compensation Controller ("DPGCC"), which then writes the updated values to the DPRAM, as explained above. The DPGCC may apply any known algorithms to compute the path gain compensation and adjust the signal accordingly. In one advantageous embodiment the DPGCC accounts for thermal losses and non-linearity and takes into consideration overdrive protection constraints. In addition, the path gain compensation method of the present invention enables enforcement of overdrive limits, split-range control, peak clipping and preservation of RF coverage footprint.

More specifically, thermal constraints for each component in the FR path are periodically computed. New and path gain compensation factors are provided to a constraint resolver which computes a combined thermal compensation for time instants between the old and new temperature measurements. The path gain factors are used to compute new signal levels to be stored in the DPRAM.

Thereafter, various components in the RF path are analyzed to determine if given a certain path gain, which was previously stored in the DPRAM, it will operate in its non-linear range. If so then a new gain is computed to compensate for that non-linearity. Lastly, the path gain compensation is reduced if it will result in exceeding an overdrive threshold in a component.

As described herein the present invention provides many advantages over the prior art. The efficiency of the present invention helps realize a reduction in the weight, size, and cost of a base station. A base station of 12 Watts incorporating the path gain compensation techniques of the present invention may have an effective utilization of 16W. By preventing poor overload to activate prematurely, the base station operating in accordance with the present invention may have an increased air interface Erlang call capacity. Moreover, by preventing power overload from activating too late, the base station will reduce its maintenance costs due to longer equipment life. In this regard conventional wisdom is that a reduction of the average operating temperature by 10 degrees Celsius, allows equipment to last significantly longer.

DETAILED DESCRIPTION OF THE INVENTION

Figure 1:
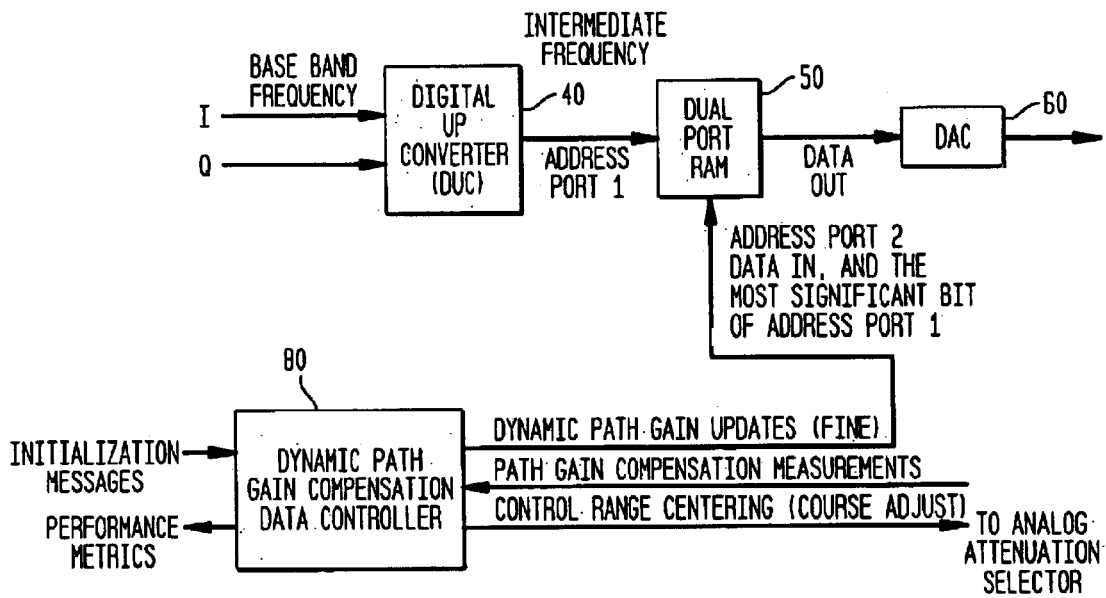
FIG. 1 is a schematic of the digital front end of a code division multiple access base station radio.

Shown in FIG. 1 is part of the digital front end of a code division multiple access ("CDMA") base station radio in accordance with one advantageous embodiment of the present invention. In this embodiment, a dual port random access memory ("DPRAM") 50 is inserted between the digital up converter ("DUC") 40 and the digital to analog converter ("DAC") 60. In an alternative embodiment, two DPRAMs may be inserted at the input to the DUC 40, one for each of the I and Q streams. 12–14 parallel digital samples are clocked at any one time from DUC 40 to address port 1 of DPRAM 50. DPRAM 50 outputs a substitute value on its data lines, which goes to the DAC 60 where the substitute value is converted to an analog signal.

DPRAM 50 is divided into two halves. Each half comprises 4 k or 16 k memory locations for 12 or 14 parallel digital samples, respectively. Only one table is active at a time. Each half of the DPRAM 50 thus contains a set of addresses, each of the addresses containing a substitute value for every possible sample value of the Intermediate Frequency ("IF"), or Radio Frequency ("RF"), assuming the DPRAM is fast enough in the latter case. The substitute value is the IF value adjusted for path gain variance. Thus, rather than compute path gain and adjust the level of the actual signal, every possible adjustment is pre-calculted and ready to replace the actual signal.

One half of DPRAM 50 actively drives DAC 60, while the other half is inactive and can be updated without affecting the active half DPRAM 50 can be accessed at twice the IF sample rate with access alternating between the active and inactive halves. The active half is read by DUC 40 via address port 1 to feed DAC 60. The inactive half receives an updated set of data via address port 2 from the Dynamic Path Gain Compensation Controller ("DPGCC") implemented by processor 30, hereinafter referred to as DPGCC 30.

The DPGCC 30 can dynamically switch between halves of the address space of DPRAM 50. One of the address lines, advantageously the one representing the most significant bit of address port 1, has a series inverter. The state of this inverter is controlled by a flip flop, which has two states: 0 and 1. In the zero state, the inverter is active between the DPGCC 30 and DPRAM 50 address line only. In the one state, the inverter is active between the DUC 40 and DPRAM 50 address line only. Alternatively, the inverter may be designed to reflect the reverse situation.

The key is using the same address line, which always has the opposite state when accessed by the DUC 40 and DPGCC 30. When the DPGCC 30 changes the state of the flip flop, the memory spaces are swapped between the DPGCC 30 and DUC 40.

It is also possible to divide the DPRAM into more than two blocks and using an appropriate number of address lines to indicate which of the multiple blocks are active. For example if the DPRAM was divided into four blocks, two address lines could be used to determine the active block. Similarly, eight blocks would use three address lines.

The DPGCC 30 can also read DPRAM 50 to verify that the DPRAM 50 is operating as expected. This is accomplished through known RAM self-checking algorithms. For example, DPGCC 30 can write an address to DPRAM 50, read the address, overwrite with the address complement and read back. This confirms that each bit will accept a zero and a 1 and that it will store what is being written. Effectively, the DPGCC 30 can check for open address lines, shorted address lines, open data lines, shorted data lines, and defective memory cells.

DPGCC 30 also coordinates control range-centering with an analog attenuation selector in the downstream analog section of the radio. Control range-centering is used where relatively large path gain compensation is required to adjust for a shift in the nominal signal. Rather than use the 12 or 14 bit address in the DPRAM to account for this shift as well as for ordinary losses, the nominal signal is re-centered using an analog attenuator in the analog downstream path. Consequently, the full range of the DPRAM is available for fine scale compensation of path gain losses. In CDMA, this offers more optimal use of the linear range of the down stream RF path components. If eight downstream attenuation settings are available, the accuracy of a DPRAM bit can be increased four to eight times. With finer compensation, the path gain will behave with greater linearity.

With range splitting between DPRAM 50 and an analog attenuator, the DPRAM could, in one advantageous embodiment, operate over +/−0.5 dB and achieve an effective +/−3 dB range. Wider or narrower control ranges are also possible, including a +/−6 dB path gain compensation range. The range-centering analog attenuation can be changed in various step sizes including in one embodiment 0.5 dB and in another embodiment, 0.1 dB, over a 0 to 15 dB range.

Two major components dominate the RF path gain; the radio and the amplifier. Both components have path gains that typically vary +1/−0.75 dB and +0.5/−1 dB, respectively over the operational temperature range. This assumes that the components perform self compensation internally for temperature variation. These path gain errors are additive, giving a +1.5/−1.75 dB variance from the nominal path gain. The corresponding DPRAM multiplier range would be +1.75/−1.5 dB above and below unity gain. Unity gain means no compensation; a fixed bias could be added to optimize the range/accuracy trade-off for the DAC 60 converter and this fixed bias would be subtracted by the range centering.

A single range centering setting of −1.5 dB could be used to shift the DPRAM operational range to +3.25/0 dB to reduce the DAC 60 quantization noise. Alternatively, five range centering settings of +1, +0.5, 0, −0.5, and −1 dB could be used to establish 6 finer resolution DPRAM multiplication ranges of +0.75/−0.5 dB. It is a matter of choice as to the number of range settings and how to divide the compensation between the attenuator and the DPRAM. In one advantageous embodiment the attenuator is used to compensate for the full range allowed by the setting, with the DPRAM used to compensate for values between settings. Thus in the example of the five settings, given above, where +1.25 dB is required the attenuator can be set to provide +1 dB and the DPRAM will provide +0.25 dB.

It will be recognized that there are a number of ways for the compensation to be divided between the attenuator and DPRAM. Thus in the example above, 1 dB at the attenuator and 0.25 dB at the DPRAM is equivalent to 1.5 dB at the attenuator and −0.25 dB at the DPRAM. In one advantageous embodiment, for any required compensation the range setting is not changed from the existing setting unless a change in compensation of 0.25 dB or more is required. This 0.25 dB allows overlap of the ranges to create a hysteresis band so the range centering does not chatter between ranges.

The DPGCC 30 re-centers the control range by first updating DPRAM 50 and then, after a delay, if necessary, accounting for the signal propagation from the DPRAM 50 to the analog attenuation selector, updating the attenuation selector. In practice, however, the signal propagates from the DPRAM 50 to the attenuation selector on the order of a few microseconds. This is for all practical purposes a negligible propagation delay.

Preferably, range-centering is performed at a light traffic loading (i.e., at low signal levels), which is sensed ahead of the DUC 40 to minimize the noise generated if the range-centering and DPRAM block change are not precisely synchronized.

As mentioned above, dynamic path gain compensation using a dual port ram in accordance with the present invention can use any path gain compensation algorithms. For example, the scheme taught in United State Patent Application, entitled "A Method and Apparatus for Reducing Adjacent Channel Power in Wireless Communication Systems", commonly assigned with the subject application and filed on the same day as the subject application. However, as noted many of the prior art algorithms take a myopic view and address only a particular constraint. In one advantageous embodiment of the present invention a new set of algorithms are used for path gain compensation, which account for three categories of hardware limitations: thermal constraints, non-linearities in the system and overload protection.

Figure 2:
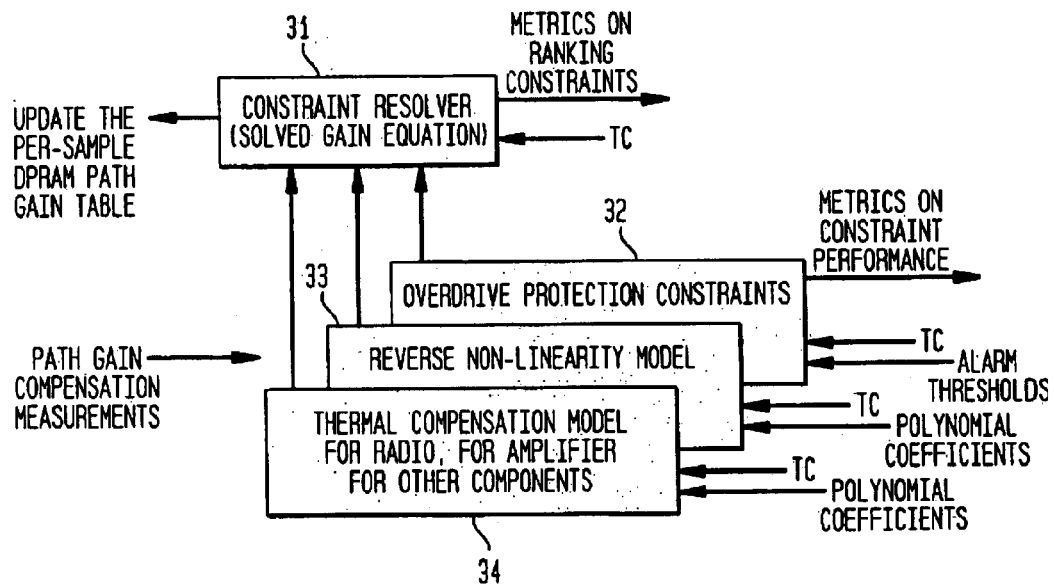
FIG. 2 is a schematic of the operational functions of the dynamic path gain compensation controller of the present invention.

Referring to FIG. 2, these three types of hardware limitations are separately modeled as shown at 32–34, but part of one control solution. For each category, Path Gain Compensation is computed for each component of the base station with a hardware limitation. Thus for the thermal compensation model 34, path gain compensation is computed for every radio, amplifier and other components, based on temperature measurements at or near the component, a set measurement filtering time constants (TC), and coefficients, or thresholds characteristic of the component. A combined path gain compensation is computed and sent to the constraint resolver 31 to combine with the path gain compensation computed by model 33 and form a unique continuous solution for updating DPRAM 50 and to control range-centering, as described above and shown in FIG. 1. The constraint resolver 31 computes the linear path gain compensation, multiples that with all possible input values and updates one of the two tables in the DPRAM 50 with those values.

The TC for each component input to the models 32–34 are set with the objective to remove high rate of change measurement noise from a low rate of change measurement. In other words the TCs are used to tune an exponential filter to smooth the component temperature measurements, which are typically sampled ten times faster than the model update rate, to lower the measurement noise. As a rule of thumb, the TC for each component is set as the amount of time it takes to read 63.2% of a step change in the constraint. Thus, for example, if a 10 degree Celsius change is expected in an hour, a two minute time constant and a 10 second sampling rate might be an advantageous choice to remove noise of higher frequency than 1 cycle in 2 minutes. The filtered measurement lags the instantaneous measurement in time by one TC (i.e., 2 minutes), resulting in a worst case temperature measurement error of a third of a degree C, which is acceptable. (e.g., a 10 degree change in 60 minutes is effectively a third of a degree change in 2 minutes as an equivalent ratio). As described further below, the TCs of each component are instrumental in computing the path gain sent to the constraint resolver 31.

Various performance metrics may also be collected from time to time (as shown in FIG. 2) from each constraint and from the constraint resolver 31, to facilitate tuning optimization and for triggering an alarm if a constraint fails. For example, in one embodiment of the present invention, the highest and lowest path gain per hour might be recorded and passed to the Operations, Administration, and Maintenance ("OAM") System as service metrics. Other metrics might include the average value and variance of the path gain. A failed constraint may, for example be a temperature reading which is known to be an error reading. Such a failure may require ignoring the measurement for that component until the measuring device (e.g. thermocouple) is replaced or fixed, using instead the temperature measurement from the next nearest component.

Figure 3:
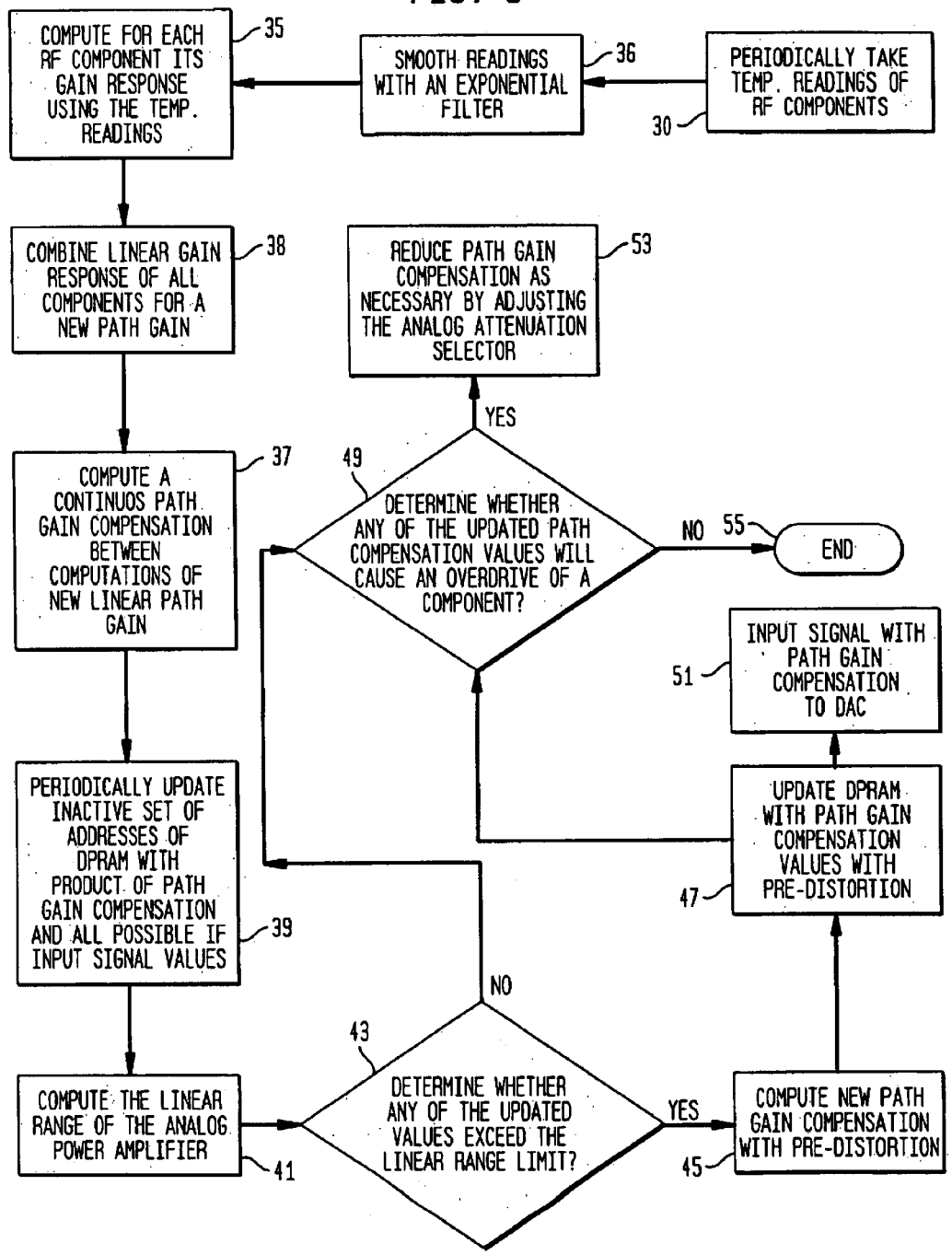
FIG. 3 is a flow chart of one embodiment of the present invention.

Referring now to each method of computing path gain compensation and with reference to FIGS. 2 and 3, we start with the Thermal Compensation Model 34. For each component, an nth order polynomial, typically fifth order, can be used to describe path gain as a function of temperature: Gain=$a(0)x^5+a(1)x^4+a(2)x^3+a(3)x^2+a(4)x^1+a(5)$, where x is a specific temperature, and a[0 . . . 5] are data values stored in the RF component that describe how its path gain changes over temperature. These values are obtained for each individual RF component, such as the radio, amplifier and upconverter, by observing them over a range of temperatures during factory verification testing as part of the manufacturing process. The resulting characteristics can be distilled down to a half dozen parameters, a[0 . . . 5], and stored in the RF component. Every time the base station is started-up, it reads these parameters out of each RF component and passes the values to the DPGCC 30. A single value for path gain results from solving the polynomial at a specific operational temperature.

One software implementation of this fifth order polynomial in C language source code is:

```
y=a[0];

for(i=1; i<=5;i++) y=y*x+a[i];

gain=y;
```

The variable x is the filtered temperature, which is computed for each sample instant. It is determined as a function of the TC for that component and the instantaneous temperature measurement, temp. Specifically, the value of x at time instant t is set equal to $x_t=(1-[1/TC])*x_{t-1}+[1/TC]*temp_t$. As shown in block 30, temperature readings are periodically obtained at a variety of different locations in and around the system. These include outside and inside ambient air, each DC power supply, each amplifier, the radio, and at any of the components. The frequency at which temperature in the system is measured, is a design choice, which one skilled in the art and familiar with a particular system will readily be able to determine. Typically, the frequency may be from once a second to once a minute. In one advantageous embodiment of the present invention the temperature of any particular component is measured every ten (10) seconds.

Each component in the transceiver may have a separate path gain characterization function. Complex components may have separate path gain characterizations for their parts. As shown in block 35, the Thermal Compensation Model 34 processes the thermal constraints associated with each component or component part (which may be treated separately as a component) and provides the constraint resolver 31 with an old and new path gain (i.e., two values). The new path-gain is the single-element equivalent path gain after combining all the series and parallel component path gain solutions, as shown in block 38. The gain of two components X and Y in series in the circuit is simply X*Y, while the combined gain of two components X and Y in parallel in the circuit is 1/(1/X+1/Y). The old path gain is the new path gain that was created the last time the thermal compensation model was processed. At initialization the same values are assigned to the old and new path gains. This insures constant path gain over the operational temperature range for each part of the RF path, which is more accurate than an end-to-end path gain calibration.

Calibrating the path gain for each component and adding them together is equivalent to an end to end calibration, but more efficient. For example, computing path gain for five $5^{th}$ order polynomial calibrations in series is equivalent to an end to end calibration using a $25^{th}$ order polynomial calibration, but much more practical. Furthermore, calibrating components individually in the factory is more accurate and less costly than periodically calibrating a system in the field. In contrast and at the other extreme, the prior art determines path gain by measuring CDMA power near the base station antenna connector. This is less accurate than the method of the present invention because it requires a complicated conversion from the measured peak power to the desired average power RMS (RMS is the direct current equivalent heating value of the power) This peak to average conversion is prone to error and the power sensor sensitivity and log amplifier calibration can drift in accuracy.

As shown in block 37, between executions of the Thermal Compensation Model 32, the constraint resolver 31 uses the resolver TC to progressively interpolate the old and new path gains to gradually and smoothly apply a change in thermally-sensitive path gain. A TC of 1 would have no interpolation points. A TC of 4 would have three (3) interpolation points. The resolver TC is set so that the difference between path gain compensation update values of any two consecutive time instants is not so great so as to cause problems in the base station.

The interpolated path gain compensation value Y is updated to DPRAM 50 at a time t determined as $(1-[1/TC])*Y_{t-1}+[1/TC]*$(linear gain determined by model 34), block 39.

The Inverse Non-Linearity Model 33 models a set of constraints that describes when the path gain stops being linear and starts to roll-off exponentially. The objective sought by implementing the Inverse Non-Linearity Model 33 in accordance with the present invention is to appropriately boost the path gain so as to overcome the extra downstream attenuation. As a result, the effect of the downstream non-linearity is canceled and end-to-end linear performance is realized. This form of compensation is known as pre-distortion.

Significant cost can be saved in the amplifier by removing circuitry that functions to improve path gain linearity. The phase distortion associated with such linearity improving circuitry also disappears, which is another advantage with this embodiment of the present invention. Similarly, the prior art requires costly large power amplifiers prior to the transmission antennae, with large linear range. In accordance with the present invention and the pre-distortion described above to compensate for non-linearity that is expected downstream, it is not necessary to use amplifiers with large linear range. Even large power amplifiers which have significant non-linear range (and thus less costly) will suffice, because the non-linearity will be compensated.

At manufacturing, each component is analyzed to determine the rate at which temperature will cause the component to respond in a non-linear fashion. This rate will dictate the nth degree polynomial which must be used to determine the non-linear path gain compensation of the component. It is generally preferred that the smallest degree equation that will yield a path gain so as to bring the response of the component within the linear range, will be used. Typically, a fifth order polynomial is used.

Once the degree n of the polynomial is determined, a table of n+1 by n+1 coefficients, B, are computed, representing the hardware limitations for the component, specified in terms of the start of the non-linearity in dBm (10 times the logarithm of the ratio of output power to 1 mWatt), the initial rate of gain roll-off, and the initial acceleration of gain roll-off. In an extreme case, the initial rate of change of acceleration could also be included when modeling a constraint. These parameters can be stored in the RF component coefficients during manufacture, similar to the thermal coefficients discussed above.

Non-linear path gain compensation for a particular component is determined from the component's coefficients b, which for a typical fifth order polynomial is a matrix of 6×6 coefficients. Initially, a set of variables a (from 0 to n) are computed where $a(n)=b(n,0)x^5+b(n,1)x^4+b(n,2)x^3+b(n,3)x^2+b(n,4)x+b(n,5)$, block 41. It should be noted that the stored coefficients B are in units of dBm, while variable a is measured in dB. Associated with the non-linear component is a conversion factor $dB_{offset}$ which relates the path gain in dB to dBm units, where a gain of y in dB units is equal to $y+dB_{offset}$ in dBm units.

One software implementation of this fifth order polynomial is shown below in C language source code, where x is the temperature measurement and the b coefficients describe how the non-linearity changes over temperature. This algorithm is computed once for a specific temperature to get the a (0 . . . 5) coefficients:

for($j=1;j<=5;j++$){$w=b[j,0]$];

for($i=1;i<=5;i++$)$w=w*x+b[j,i]$;

$a[j]=z;$};

The constraint resolver 31 compares each gain value y, updated to DPRAM 50 with a(5) and computes their difference to determine which values are affected by the non-linear region. The non-linear region starts at $a(5)-dB_{offset}$ in units of dB. Any values of y that are in the non-linear region (e.g., greater than $a(5)-dB_{offset}$ are to be boosted by the amount the non-linearity will attenuate the signal. While the linear gains may be compared with $a(5)-dB_{offset}$ in any order, they are advantageously reviewed beginning with the largest value, block 43. If any of the values are found to be greater than $a(5)-dB_{offset}$, it is an indication that the gains would exceed the dBm level where the power amplifier in the analog end of the base station would exceed the linear range. Constraint resolver 31 then decides to replace the gain y with the new gain value z. The new gain value z is the path gain compensation which accounts for non-linearity and thereby pre-distorts the signal so that the response of the power amplifier remains in the linear range, blocks 45–47.

This new gain is computed by the Inverse Non-Linearity Model 33 as (assuming a fifth order polynomial), $z=a(0)Y^5+a(1)Y^4+a(2)Y^3+a(3)Y^2+a(4)Y^1+a(5)$ and where $Y=y-a(5)+dB_{offset}$. One replacement gain is computed for each component in the same sequence as the signal propagates. As with the linear path gain discussed above, the constraint resolver computes the product of the gain with every possible input value to DPRAM 50 and thereafter updates its active table with these values.

The overdrive protection constraint model 34 protects the physical equipment against violating physical limits that could cause damage. Without affecting the update interval schedule of the DPRAM 50, path gain can be reduced to provide partial service under abnormal operational conditions. Examples include: when a component temperature exceeds an alarm threshold to guard against automatic shutdown; when a power supply current exceeds an alarm threshold to guard against tripping a circuit breaker; or when the path gain is radically altered by the misbehavior of a component. This model can also continue to provide service, albeit degraded, when parallel components are lost.

When a threshold is crossed as determined in block 49, path gain is lowered by the appropriate fixed dB attenuation by selecting a lower analog attenuator setting, block 53. This can be a fixed step amount, such as 50%, or a function of a more complex equation such as a fifth order polynomial. In one advantageous embodiment of the invention, overdrive protection control triggers a ⅓ reduction in output power.

Any fixed step gain adjustment can be processed in the overdrive model, including: changing the attenuation to set the RF coverage footprint; path gain calibration for FCC compliance; and automatic control of range-centering. The portion of the non-linearity model beyond the attenuator is affected because the power stays in the linear operating range. The power measurement reports are also affected to reflect the change in transmitted power.

While the invention has been described to some extent in the context of CDMA technology, it is applicable to any type of radio, independent of the way the radio is modulated. Examples include CDMA, Time Division Multiple Access ("TDMA"), Global System For Mobile Communication ("GSM"), and Frequency Division Multiple Access ("FDMA") modulation technologies.

The foregoing merely illustrates the principles of the present invention. Those skilled in the art will be able to devise various modifications, which although not explicitly described or shown herein, embody the principles of the invention and are thus within its spirit and scope.

What is claimed is:

1. A method for path gain compensation in a cellular base station transceiver to adjust a digital signal for losses in the base station, said transceiver including a digital to analog converter, said method comprising the steps of:

periodically computing a path gain compensation factor based on the state of the cellular base station;

computing replacement signal levels for a plurality of possible levels of said digital signal input to said digital to analog converter, said replacement signal levels being equivalent to said digital signal levels, adjusted with said path gain compensation factor;

periodically storing said replacement signal levels in an inactive block in a dual port ram through a first port, said dual port ram receiving said digital signal at a second port and for each sample of said digital signal, outputting one of said replacement signal levels to said digital to analog converter from said active block;

inverting the binary state of at least one address line common to said first port and said second port of said dual port ram so as to activate said block with said replacement signal levels and direct an input digital signal to said dual port ram, to said active block;

outputting from said dual port ram the replacement signal level stored at the address location pointed to by the binary value of the digital signal received through said second port and the present state of said at least one address line to said dual port ram; and receiving said output replacement signal level by said digital to analog converter.

2. The method of claim 1 wherein said periodically computing step further comprise the steps of:

periodically measuring the temperature at a variety of locations within said base station system;

computing based on said temperature measurements, an appropriate path gain for each component of said base station on said RF path to compensate for linear losses said component may introduce to said RF path due to said temperature;

combining said path gain compensation of each of said components into a single end to end path gain compensation factor; and computing a continuous path gain compensation value by interpolating between said computed path gain compensation and the path gain compensation computed at an earlier time, said continuous path gain compensation value being said path gain compensation factor.

3. The method of claim 2 further comprising the steps of:

computing the linear range limit of a power amplifier at the analog stage of said base station;

determining whether any of said replacement signal levels computed during said computing replacement signal levels, will cause said power amplifier to exceed said linear range;

computing pre-distorted replacement signal levels to cancel any non-linearity at said power amplifier; and replacing said previously computed replacement signal levels stored in said DPRAM that will cause said power amplifier to exceed said linear range with said pre-distorted replacement signal levels.

4. The method of claim 3 further comprising the steps of:

determining whether any of said replacement signal levels stored in said DPRAM will cause an overdrive of a component; and reducing those of said replacement signal levels stored in said DPRAM so as to avoid said overdrive of said component.

5. The method of claim 4 wherein said replacement signal levels which are reduced are reduced in power to one third of their original power level.

6. The method of claim 4 wherein said replacement signal levels which are reduced, are reduced in power to one half of their original power.

7. The method of claim 1 further comprising the step of range centering said path gain compensation with an analog attenuator prior to transmission of an analog conversion of said digital signal from said cellular base station.

8. The method of claim 1 wherein said analog attenuator is set with a plurality of range settings, wherein said range centering further comprises the step of adjusting said range centering from one of said plurality of settings to another only where there is a change in path gain compensation of at least 0.25 dB.

* * * * *